United States Patent
Lee et al.

(10) Patent No.: US 7,112,520 B2
(45) Date of Patent: Sep. 26, 2006

(54) SEMICONDUCTOR DIE PACKAGES WITH RECESSED INTERCONNECTING STRUCTURES AND METHODS FOR ASSEMBLING THE SAME

(75) Inventors: Teck Kheng Lee, Singapore (SG); Cher Khng Victor Tan, Singapore (SG)

(73) Assignee: Micron Technology, Inc., Boise, ID (US)

( * ) Notice: Subject to any disclaimer, the term of this patent is extended or adjusted under 35 U.S.C. 154(b) by 51 days.

(21) Appl. No.: 10/150,516

(22) Filed: May 17, 2002

(65) Prior Publication Data
US 2003/0164540 A1    Sep. 4, 2003

(30) Foreign Application Priority Data
Mar. 4, 2002 (SG) .............................. 200201290-4

(51) Int. Cl.
*H01L 21/44* (2006.01)
(52) U.S. Cl. ....................................... 438/612; 438/107
(58) Field of Classification Search ............... 257/686, 257/777; 438/107, 109, 110, 612, 613, 125; 228/180.21, 180.22
See application file for complete search history.

(56) References Cited

U.S. PATENT DOCUMENTS

| | | | |
|---|---|---|---|
| 3,239,496 A * | 3/1966 | Jursich | 526/83 |
| 4,074,342 A * | 2/1978 | Honn et al. | 361/779 |
| 4,807,021 A | 2/1989 | Okumura | |
| 4,818,728 A | 4/1989 | Rai et al. | |
| 4,954,875 A | 9/1990 | Clements | |
| 5,148,265 A | 9/1992 | Khandros | |
| 5,241,456 A | 8/1993 | Marcinkiewicz et al. | |
| 5,346,861 A | 9/1994 | Khandros | |
| 5,347,159 A | 9/1994 | Khandros et al. | |
| 5,366,794 A | 11/1994 | Nakao | |
| 5,385,869 A | 1/1995 | Liu et al. | |
| 5,386,341 A | 1/1995 | Olson et al. | |
| 5,397,921 A | 3/1995 | Karnezos | |
| 5,404,044 A * | 4/1995 | Booth et al. | 257/698 |
| 5,409,865 A | 4/1995 | Karnezos | |

(Continued)

FOREIGN PATENT DOCUMENTS
EP    0475022 A1    3/1992
(Continued)

OTHER PUBLICATIONS

Al-Sarawi et al., "A review of 3-D packaging technology," Components, Packaging, and Manufacturing Technology, Part B: IEEE Transactions on Advanced Packaging, vol. 21, Issue 1, Feb. 1998, pp. 2-14.

(Continued)

*Primary Examiner*—S. V. Clark
(74) *Attorney, Agent, or Firm*—TraskBritt

(57) ABSTRACT

Apparatus and methods relating to semiconductor assemblies. A semiconductor assembly includes an interposer which may be constructed from a flexible material, such as a polyimide tape. A pattern of conductive traces disposed on a first surface of the interposer is in electrical communication with a semiconductor die attached to the first surface. Interconnect recesses accessible on the opposite second surface expose one or more conductive traces. A conductive element, such as a solder ball, disposed substantially within the interconnect recess allows the assembly to be mounted on a substrate or a similar assembly. By substantially containing the conductive element within the interconnect recess, the height of the completed assembly is reduced. Assemblies may be stacked to form multidie assemblies. Interconnect structures, such as connection pads, or enlarged traces upon the first surface are employed to connect stacked assemblies.

53 Claims, 4 Drawing Sheets

U.S. PATENT DOCUMENTS

| | | |
|---|---|---|
| 5,422,205 A | 6/1995 | Inoue et al. |
| 5,438,477 A | 8/1995 | Pasch |
| 5,448,511 A | 9/1995 | Paurus et al. |
| 5,468,681 A | 11/1995 | Pasch |
| 5,489,804 A | 2/1996 | Pasch |
| 5,504,277 A | 4/1996 | Danner |
| 5,598,033 A | 1/1997 | Behlen et al. |
| 5,608,265 A | 3/1997 | Kitano et al. |
| 5,646,446 A | 7/1997 | Nicewarner, Jr. et al. |
| 5,663,530 A | 9/1997 | Schueller et al. |
| 5,668,405 A | 9/1997 | Yamashita |
| 5,674,785 A | 10/1997 | Akram et al. |
| 5,679,977 A | 10/1997 | Khandros |
| 5,683,942 A | 11/1997 | Kata |
| 5,697,148 A | 12/1997 | Lance, Jr. et al. |
| 5,710,071 A | 1/1998 | Beddingfield et al. |
| 5,719,449 A | 2/1998 | Strauss |
| 5,721,151 A | 2/1998 | Padmanabhan et al. |
| 5,723,347 A | 3/1998 | Hirano et al. |
| 5,739,585 A | 4/1998 | Akram et al. |
| 5,742,100 A | 4/1998 | Schroeder et al. |
| 5,747,982 A | 5/1998 | Dromgoole et al. |
| 5,752,182 A | 5/1998 | Nakatsuka et al. |
| 5,758,413 A | 6/1998 | Chong et al. |
| 5,768,109 A | 6/1998 | Gulick et al. |
| 5,777,391 A | 7/1998 | Nakamura |
| 5,798,285 A | 8/1998 | Bentlage et al. |
| 5,798,567 A | 8/1998 | Kelly et al. |
| 5,805,422 A | 9/1998 | Otake et al. |
| 5,812,378 A | 9/1998 | Fjelstad et al. |
| 5,818,113 A | 10/1998 | Iseki et al. |
| 5,821,624 A | 10/1998 | Pasch |
| 5,834,338 A | 11/1998 | Takeda et al. |
| 5,834,366 A | 11/1998 | Akram |
| 5,834,848 A | 11/1998 | Iwasaki |
| 5,835,355 A | 11/1998 | Dordi |
| 5,843,808 A | 12/1998 | Karnezos |
| 5,844,168 A | 12/1998 | Schueller et al. |
| 5,844,315 A | 12/1998 | Melton et al. |
| 5,866,953 A | 2/1999 | Akram et al. |
| 5,886,408 A | 3/1999 | Ohki et al. |
| 5,891,753 A | 4/1999 | Akram |
| 5,892,271 A | 4/1999 | Takeda et al. |
| 5,898,224 A | 4/1999 | Akram |
| 5,905,303 A | 5/1999 | Kata |
| 5,973,389 A | 10/1999 | Culnane et al. |
| 5,973,404 A | 10/1999 | Akram et al. |
| 5,977,640 A | 11/1999 | Bertin et al. |
| 5,982,030 A | 11/1999 | MacIntrye |
| 5,984,691 A | 11/1999 | Brodsky et al. |
| 5,986,460 A | 11/1999 | Kawakami |
| 5,990,545 A | 11/1999 | Schueller et al. |
| 5,991,161 A | 11/1999 | Samaras et al. |
| 6,005,776 A | 12/1999 | Holman et al. |
| 6,008,543 A | 12/1999 | Iwabuchi |
| 6,011,694 A | 1/2000 | Hirakawa |
| 6,013,948 A | 1/2000 | Akram |
| 6,020,629 A | 2/2000 | Farnworth |
| 6,022,761 A | 2/2000 | Grupen-Shemansky et al. |
| 6,024,584 A | 2/2000 | Lemke et al. |
| 6,027,346 A | 2/2000 | Sinsheimer et al. |
| 6,028,365 A | 2/2000 | Akram et al. |
| 6,034,427 A | 3/2000 | Lan et al. |
| 6,037,665 A | 3/2000 | Miyazaki |
| 6,039,889 A | 3/2000 | Zhang et al. |
| 6,040,630 A | 3/2000 | Panchou et al. |
| 6,048,755 A | 4/2000 | Jiang et al. |
| 6,050,832 A | 4/2000 | Lee et al. |
| 6,057,178 A | 5/2000 | Galuschki et al. |
| 6,060,782 A | 5/2000 | Ohsono et al. |
| 6,064,114 A | 5/2000 | Higgins, III |
| 6,072,233 A | 6/2000 | Corisis et al. |
| 6,074,897 A | 6/2000 | Degani et al. |
| 6,075,710 A | 6/2000 | Lau |
| 6,079,991 A | 6/2000 | Lemke et al. |
| 6,093,035 A | 7/2000 | Lemke et al. |
| 6,116,921 A | 9/2000 | Scholz et al. |
| 6,124,631 A | 9/2000 | Cardot et al. |
| 6,127,736 A | 10/2000 | Akram |
| 6,133,072 A | 10/2000 | Fjelstad |
| 6,133,637 A | 10/2000 | Hikita et al. |
| 6,137,062 A | 10/2000 | Zimmerman |
| 6,137,164 A | 10/2000 | Yew et al. |
| 6,137,183 A | 10/2000 | Sako |
| 6,157,541 A | 12/2000 | Hacke |
| 6,165,885 A | 12/2000 | Gaynes et al. |
| 6,172,422 B1 | 1/2001 | Chigawa et al. |
| 6,177,723 B1 | 1/2001 | Eng et al. |
| 6,179,598 B1 | 1/2001 | Brand |
| 6,180,881 B1 | 1/2001 | Isaak |
| 6,191,487 B1 | 2/2001 | Rodenbeck et al. |
| 6,208,521 B1 | 3/2001 | Nakatsuka |
| 6,208,525 B1 | 3/2001 | Imasu et al. |
| 6,212,768 B1 | 4/2001 | Murakami |
| 6,214,156 B1 | 4/2001 | Takano et al. |
| 6,217,343 B1 | 4/2001 | Okuno |
| 6,218,202 B1 | 4/2001 | Yew et al. |
| 6,219,911 B1 | 4/2001 | Estes et al. |
| 6,221,763 B1 | 4/2001 | Gilton et al. |
| 6,222,265 B1 | 4/2001 | Akram et al. |
| 6,225,688 B1 | 5/2001 | Kim et al. |
| 6,229,711 B1 | 5/2001 | Yoneda |
| 6,232,666 B1 | 5/2001 | Corisis et al. |
| 6,239,496 B1 * | 5/2001 | Asada ..................... 257/777 |
| 6,242,932 B1 | 6/2001 | Hembree |
| 6,262,895 B1 | 7/2001 | Forthun |
| 6,265,775 B1 | 7/2001 | Seyyedy |
| 6,271,469 B1 | 8/2001 | Ma et al. |
| 6,281,046 B1 | 8/2001 | Lam |
| 6,285,081 B1 | 9/2001 | Jackson |
| 6,291,265 B1 | 9/2001 | Mess |
| 6,291,775 B1 | 9/2001 | Saitoh |
| 6,291,884 B1 | 9/2001 | Glenn et al. |
| 6,294,455 B1 | 9/2001 | Ahn |
| 6,295,730 B1 | 10/2001 | Akram |
| 6,300,679 B1 | 10/2001 | Mukerji et al. |
| 6,310,288 B1 | 10/2001 | Moden |
| 6,313,522 B1 | 11/2001 | Akram et al. |
| 6,323,060 B1 | 11/2001 | Isaak |
| 6,338,985 B1 | 1/2002 | Greenwood |
| 6,376,769 B1 | 4/2002 | Chung |
| 6,404,648 B1 | 6/2002 | Slupe et al. |
| 6,407,450 B1 | 6/2002 | Verma et al. |
| 6,413,102 B1 | 7/2002 | Jiang et al. |
| 6,429,516 B1 | 8/2002 | Tsunoi |
| 6,432,737 B1 | 8/2002 | Webster |
| 6,452,807 B1 | 9/2002 | Barrett |
| 6,468,831 B1 | 10/2002 | Leong et al. |
| 6,482,676 B1 | 11/2002 | Tsunoi et al. |
| 6,489,676 B1 * | 12/2002 | Taniguchi et al. .......... 257/698 |
| 6,489,687 B1 | 12/2002 | Hashimoto |
| 6,492,737 B1 | 12/2002 | Imasu et al. |
| 6,507,098 B1 | 1/2003 | Lo et al. |
| 6,515,324 B1 | 2/2003 | Shibuya et al. |
| 6,518,677 B1 | 2/2003 | Capote et al. |
| 6,534,853 B1 | 3/2003 | Liu et al. |
| 6,552,910 B1 | 4/2003 | Moon et al. |
| 6,563,223 B1 | 5/2003 | Freeman |
| 6,586,830 B1 | 7/2003 | Saito |
| 6,600,222 B1 | 7/2003 | Levardo |
| 6,634,100 B1 | 10/2003 | Akram et al. |
| 6,650,007 B1 | 11/2003 | Moden et al. |
| 6,714,418 B1 * | 3/2004 | Frankowsky et al. ....... 361/735 |
| 6,730,855 B1 | 5/2004 | Bando |

| | | |
|---|---|---|
| 6,744,122 B1 | 6/2004 | Hashimoto |
| 6,756,251 B1 | 6/2004 | Lee |
| 6,791,195 B1 | 9/2004 | Urushima |
| 6,858,926 B1 | 2/2005 | Moden et al. |
| 2001/0048157 A1 | 12/2001 | Murtuza |
| 2001/0053563 A1 | 12/2001 | Kim et al. |
| 2002/0045611 A1 | 4/2002 | Abrams et al. |
| 2002/0079594 A1 | 6/2002 | Sakurai |
| 2002/0127769 A1 | 9/2002 | Ma et al. |
| 2002/0142513 A1 | 10/2002 | Fee et al. |
| 2002/0167092 A1 | 11/2002 | Fee et al. |
| 2002/0185661 A1 | 12/2002 | Kawanobe et al. |
| 2003/0012930 A1 | 1/2003 | Brousseau |
| 2003/0042595 A1 | 3/2003 | Canella |
| 2003/0134450 A1 | 7/2003 | Lee |
| 2004/0026773 A1 | 2/2004 | Koon et al. |
| 2004/0212055 A1 | 10/2004 | Esposito et al. |
| 2004/0217454 A1 | 11/2004 | Brechignac et al. |

FOREIGN PATENT DOCUMENTS

| | | |
|---|---|---|
| EP | 684644 | 11/1995 |
| EP | 0997942 A2 | 5/2000 |
| EP | 1009027 | 6/2000 |
| JP | 04030456 | 2/1992 |
| JP | 2000-183082 | 6/2000 |
| JP | 02000230964 | 8/2000 |
| JP | 2001077294 | 3/2001 |
| KR | 2001054744 | 7/2001 |
| WO | 2002-028702/04 | 9/1999 |
| WO | WO 99/65282 | 12/1999 |

OTHER PUBLICATIONS

Andros et al., "TBGA Package Technology," Components, Packaging, and Manufacturing Technology, Part B: IEEE Transactions on Advanced Packaging, vol. 17, Issue 4, Nov. 1994, pp. 564-568.

Clot et al., "Flip-Chip on Flex for 3D Packaging," 1999. 24th IEEE/CMPT, Oct. 18-19, 1999, pp. 36-41.

Ferrando et al., "Industrial approach of a flip-chip method using the stud-bumps with a non-conductive paste," Adhesive Joining and Coating Technology in Electronics Manufacturing, 2000. Proceeedings. 4th International Conference on, Jun. 18-21, 2000, pp. 205-211.

Gallagher et al., "A Fully Additive, Polymeric Process for the Fabrication and Assembly of Substrate and Component Level Packaging," The First IEEE International Symposium on Polymeric Electronics Packaging, Oct. 26-30, 1997, pp. 56-63.

Geissinger et al., "Tape Based CSP Package Supports Fine Pitch Wirebonding," Electronics Manufacturing Technology Symposium, 2002, IEMT 2002, 27th Annual IEEE/SEMI International, Jul. 17-18, 2002, pp. 41-452.

Hatanaka, H., "Packaging processes using flip chip bonder and future directions of technology development," Electronics Packaging Technology Conference, 2002. 4th, Dec. 10-12, 2002, pp. 434-439.

Haug et al., "Low-Cost Direct Chip Attach: Comparison of SMD Compatible FC Soldering with Anisotropically Conductive Adhesive FC Bonding," IEEE Transactions on Electronics Packaging Manufacturing, vol. 23, No. 1, Jan. 2000, pp. 12-18.

Kloeser et al. "Fine Pitch Stencil Printing of Sn/Pb and Lead Free Solders for Flip Chip Technology," IEEE Transactions of CPMT—Part C, vol. 21, No. 1, 1998, pp. 41-49.

Lee et al., "Enhancement of Moisture Sensitivity Performance of a FBGA," Proceedings of International Symposium on Electronic Materials & Packaging, 2000, pp. 470-475.

Li et al., "Stencil Printing Process Development for Flip Chip Interconnect," IEEE Transactions Part C: Electronics Packaging Manufacturing, vol. 23, Issue 3, (Jul. 2000), pp. 165-170.

Lyons et al., "A New Approach to Using Anisotropically Conductive Adhesives for Flip-Chip Assembly, Part A," *IEEE Transactions on Components, Packaging, and Manufacturing Technology*, vol. 19, Issue 1, Mar. 1996, pp. 5-11.

Teo et al., "Enhancing Moisture Resistance of PBGA," *Electronic Components and Technology Conference*, 1988. 48th IEEE, May 25-28, 1998, pp. 930-935.

Teutsch et al., "Wafer Level CSP using Low Cost Electroless Redistribution Layer," *Electronic Components and Technology Conference*, 2000. 2000 Proceedings. 50th, May 21-24, 2000, pp. 107-113.

"The 2003 International Technology Roadmap for Semiconductor: Assembly and Packaging."

Tsui et al., "Pad redistribution technology for flip chip applications," *Electronic Components and Technology Conference*, 1998. 48th IEEE, May 25-28, 1998, pp. 1098-1102.

Xiao et al., "Reliability study and failure analysis of fine pitch solder-bumped flip chip on low-cost flexible substrate without using stiffener," IEEE, 2002. Proceedings 52nd, May 28-31, 2002, pp. 112-118.

Isaak, H. et al., "Development of Flex Stackable Carriers" IEEE Electronic Components and Technology Conference, 2000 Proceedings 50th, May 21, 2000-May 24, 2000, Las Vegas, NV, USA, pp. 378-384, IEEE Catalog No.: 00CH37070.

Copy of Australian Patent Office, Search Report, May 30, 2003, 4 pages.

Australian Search Report dated Aug. 11, 2004 (3 pages).

Australian Search Report dated Aug. 16, 2004 (4 pages).

Australian Search Report dated Nov. 8, 2004 (5 pages).

Australian Search Report dated Dec. 24, 2004 (5 pages).

* cited by examiner

SEMICONDUCTOR DIE PACKAGES WITH RECESSED INTERCONNECTING STRUCTURES AND METHODS FOR ASSEMBLING THE SAME

CROSS-REFERENCE TO RELATED APPLICATIONS

This application is related to U.S. patent application Ser. No. 09/944,465 filed Aug. 30, 2001 and entitled MICROELECTRONIC DEVICES AND METHODS OF MANUFACTURE, and to the following U.S. Patent Applications filed on even date herewith: Ser. No. 10/150,893, entitled INTERPOSER CONFIGURED TO REDUCE THE PROFILES OF SEMICONDUCTOR DEVICE ASSEMBLIES AND PACKAGES INCLUDING THE SAME AND METHODS; Ser. No. 10/150,892, entitled METHOD AND APPARATUS FOR FLIP-CHIP PACKAGING PROVIDING TESTING CAPABILITY; Ser. No. 10/150,653, entitled FLIP CHIP PACKAGING USING RECESSED INTERPOSER TERMINALS; Ser. No. 10/150,902, entitled METHOD AND APPARATUS FOR DIELECTRIC FILLING OF FLIP CHIP ON INTERPOSER ASSEMBLY; and Ser. No. 10/150,901, entitled METHODS FOR ASSEMBLY AND PACKAGING OF FLIP CHIP CONFIGURED DICE WITH INTERPOSER.

BACKGROUND OF THE INVENTION

1. Field of the Invention

The present invention relates to ball grid array semiconductor packages and methods of attaching and interconnecting the same. In particular, the present invention relates to interposers for mounting a semiconductor die to a substrate with which the semiconductor die is in electrical communication The semiconductor die may be encapsulated upon the interposer to form a complete semiconductor die package. The interposer may be constructed in order to allow a number of similar semiconductor die packages to be electrically connected to a single substrate in a stack.

2. State of the Art

Ball grid array ("BGA") packages are well known in the art. BGA packages typically comprise a substrate, such as a printed circuit board, with a semiconductor die mounted on top of the substrate. The semiconductor die has a multitude of bond pads electrically connected to a series of metal traces on the top side of the printed circuit board. This series of metal traces is connected to a second series of metal traces located on the underside of the printed circuit board by a series of vias. The second series of metal traces each terminate with a contact pad where a conductive element is attached. The conductive elements are typically solder balls or conductive-filled epoxy. The conductive elements are arranged in an array pattern and the semiconductor die along with its electrical connections is encapsulated with a molding compound.

As die and grid array densities increase, the desire in packaging semiconductor dies has been to reduce the overall size of the package, allowing the mounted packages to take up less "real estate" or area within a device. A BGA package mounted in a flip chip fashion conserves real estate laterally by eliminating the connection structures (wirebond, TAB, etc.) around the package. Conserving real estate vertically presents different challenges. One way this has been accomplished is by reducing the overall height or profile of BGA packages. Another way is by using molded packages with leadframes that can be stacked atop one another.

Stacking BGA packages allows additional lateral real estate to be conserved in exchange for vertical space. The height of a BGA package, including the substrate, semiconductor die, wirebonds, encapsulant and conductive elements, limits the effectiveness of this method. One example of an attempt to reduce the height of BGA packages in a stack is disclosed in U.S. Pat. No. 6,072,233 issued to Corisis et al., Jun. 6, 2000. The disclosed packages consist of a semiconductor die mounted face down on a thin substrate. The die is electrically connected to the substrate by centrally located wirebonds, which are encapsulated on the base of the substrate. Solder balls which have a height greater than the combined heights of the mounted semiconductor die and the wirebond encapsulant are spaced along the perimeter of the substrate. By moving the encapsulant to the lower surface of the package and using a thin substrate, a fine ball grid array (FBGA) can be used, reducing the overall height of a package. The ability to reduce the height of the package is still limited by the placement and size restrictions on the solder balls, which must have a diameter greater than the combined heights of the semiconductor dies and wirebond encapsulant. The substrate must be rigid to hold the individual packages apart. The solder balls are exposed at the side of the stack, increasing the chances of breakage or contamination.

Therefore, it would be advantageous to develop an apparatus and method that allow for the height of stacked packages to be reduced in comparison to conventional packages. It would further be advantageous for such an apparatus and method to provide for at least enclosing the conductive elements, providing enhanced support as well as protection from breakage and contamination. It would be an additional advantage for certain embodiments of such an apparatus and method to employ at least somewhat flexible substrates, allowing use in an increased number of applications.

BRIEF SUMMARY OF THE INVENTION

The present invention includes apparatus and methods for preparing semiconductor device packages, or assemblies. An interposer may be constructed from a flexible material, such as a polyimide tape. A pattern of conductive traces is disposed on a first surface of the interposer in electrical communication with a semiconductor die attached to that first surface. Interconnect recesses accessible on an opposite, second surface each allow contact with at least one conductive trace. A conductive element, such as a solder ball, disposed substantially within the interconnect recess is used to mechanically and electrically connect the assembly to a carrier substrate or to another, similar assembly. By substantially receiving the conductive element within the interconnect recess, the height of the completed assembly is reduced.

A number of assemblies may be stacked to form stacked semiconductor arrays. Interconnect structures, such as connection pads, or enlarged traces upon the first surface may allow for interaction between stacked assemblies. Assemblies may be stacked stepwise, or directly aligned.

DETAILED DESCRIPTION OF THE INVENTION

Figure 1:
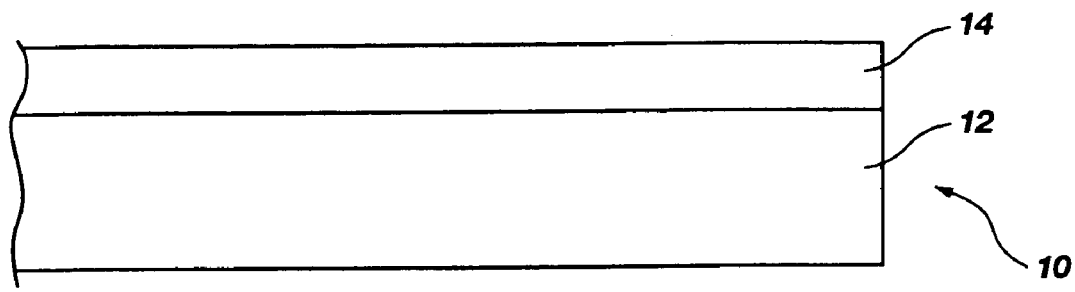
FIG. 1 is a side view of a substrate useful in assembling some embodiments of devices made in accordance with the principles of the present invention.
Figure 2:
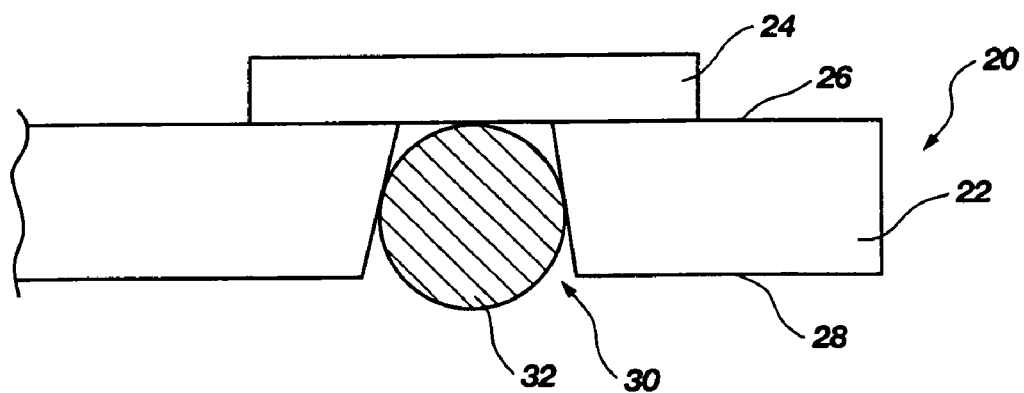
FIG. 2 is a sectional side view of a portion of one embodiment of an interposer made in accordance with the principles of the present invention.

Reference will now be made to FIGS. 1 and 2. A portion of an interposer 20 includes a substrate 22 with a recess 30 and adjacent conductive traces 24. Substrate 22 may be formed of any suitable material, including FR-4 resin and bismaleimide triazine (BT) resin, among others. In embodiments where it is desired that interposer 20 have flexibility, the substrate 22 may be formed from a flex material, such as polyimide tape. One such suitable tape is Kapton®, available from E.I. du Pont de Nemours and Company.

A recess 30 is located in a second surface 28 of the interposer body or substrate 22. Adjacent conductive traces 24 are disposed on the opposite, first surface 26 and are accessible through the recess 30. Conductive traces 24 may be in electrical communication with a semiconductor die attached to the interposer 20. Conductive traces 24 may be formed from any suitable material, including metallic traces made of copper alloys or other metals, a conductive epoxy, a plastic material containing conductive particles, or a conductive ink.

A conductive element 32 may be disposed in the recess 30, making an electrical connection with the conductive traces 24 therethrough. Desirably, recess 30 is configured such that a major portion of the conductive element 32 resides substantially within the recess 30. It will be appreciated that conductive element 32 may be formed from any number of electrically conductive attachment materials suitable for use in the interconnection of interposer 20 with higher-level packaging. Examples of conductive elements 32 include solder balls and columnar structures of conductive and conductor-filled epoxies, among others. All such suitable conductive elements 32 are within the scope of the present invention.

Where the conductive elements 32 comprise solder balls, the solder balls may be disposed within the recesses by any suitable method. Examples of such methods include: the direct placement of preformed solder balls into a pattern of recesses 30 on the second surface 28; the flooding of the second surface 28 with a plurality of solder balls followed by the removal of those balls protruding more than a fixed distance from the second surface 28 and therefore not disposed in a recess 30; and the disposition of a solder paste directly within the recesses 30, followed by reflowing the solder to form spherical elements protruding from the openings of recesses 30 or, if the recesses are sized to constrain formulation of spheres, to form hemispherical protrusions of solder from the mouths of recesses 30. A solder mask may be applied to the second surface 28 to facilitate solder ball formulation in the latter manner.

Recess 30 may be formed in the substrate 22 by any suitable means, including both additive and subtractive methods. In FIG. 1 is depicted a substrate blank 10 that may be used for forming some embodiments of interposers 20 in accordance with the present invention. Blank 10 includes a substrate layer 12 and a conductive layer 14. Recess 30 may be formed in the substrate layer by the removal of material. For example, substrate layer 12 may be cut with a laser, drilled, punched, chemically etched, or treated with an electroforming chemical to a depth sufficient to expose conductive layers. These subtractive methods may utilize a stencil or patterned resist applied to the substrate layer 12 prior to treatment. In alternative embodiments, the substrate 22 may be formed from an additive method, with the recess 30 preformed in the substrate material and laminated to a conductive layer through the use of tape adhesive.

Conductive traces 24 may similarly be formed by any suitable method, including both additive and subtractive methods. In FIG. 1, the conductive layer 14 may be etched to form a desired pattern of conductive traces 24. This may be accomplished by applying a stencil or by patterning and then removing conductive material through a chemical etch or other means. In alternative embodiments, the pattern of conductive traces 24 may be formed by depositing the conductive traces 24 on the substrate 22. Any suitable additive technique can be used, such as by preforming the conductive traces 24 or by etching or stamping and applying them to substrate 22, by applying a conductive polymer to form devices, by printing with a conductive ink, or otherwise as known in the art.

Figure 3:
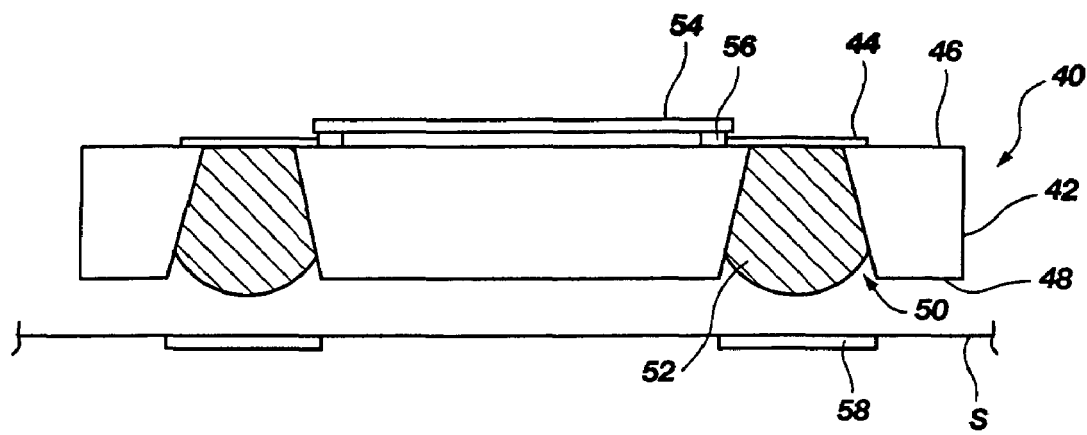
FIG. 3 is a sectional side view of one embodiment of a semiconductor package made in accordance with the principles of the present invention, shown prior to mounting.
Figure 4:
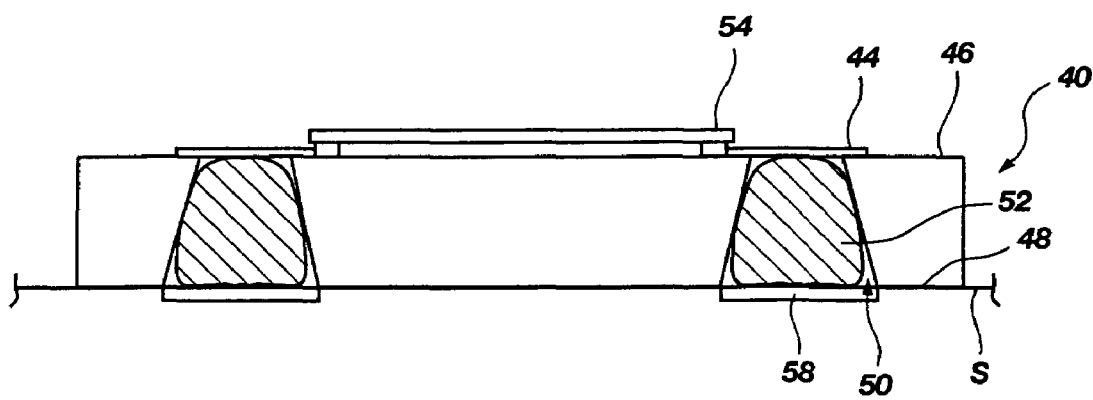
FIG. 4 is a sectional side view of the embodiment of FIG. 3, as attached to a substrate.

FIGS. 3 and 4 depict a semiconductor assembly 40 made in accordance with the principles of the present invention. It will be appreciated that FIGS. 3 and 4 are not to scale, but are only representative. A semiconductor die 54 is attached to an interposer 42. In the depicted embodiment, the semiconductor die 54 is attached in a flip chip fashion, depicted by conductive columns 56, although it will be appreciated that any method known to those skilled in the art may be used and all such methods are within the scope of the present invention. A pattern of conductive traces 44 is disposed on the first surface 46 of the interposer 42. Recesses 50 are located on opposite surface 48. Each of the conductive elements 52 residing substantially within the recesses 50 make electrical contact with at least one of the conductive traces 44, traces 44 being in electrical communication with the semiconductor die 54 through conductive columns 56. The positioning of a number of recesses 50 on the interposer 42 may be used to provide a grid array, such as a ball grid array (BGA) or fine ball grid array (FBGA), for attachment and interconnection of the semiconductor assembly 40 to higher-level packaging.

Semiconductor assembly 40 may be attached to higher-level packaging in the form of a carrier substrate S, which may be a printed circuit board (PCB) or any other suitable structure. Assembly 40 is placed on the substrate S, such that the conductive elements 52 are located on and bonded to conductive attachment points, such as the contact pads 58. It will be appreciated that in addition to contact pads 58, the attachment points may be formed of any suitable structure, including conductive traces, among others. In embodiments where the conductive elements 52 are solder balls, this may be accomplished by reflowing the solder.

The positioning of conductive elements 52 substantially within the recesses 50 allows the interposer 42 to be mounted closely to the substrate S, reducing the overall height of the assembly 40. In certain embodiments, second surface 48 of interposer 40 may even be disposed directly on the substrate S. This may be accomplished as solder ball conductive elements are reflowed to fill any space remaining around the solder ball within the recess 50. With embodiments where the interposer 42 has reduced rigidity, as when formed from a polyimide tape, the assembly 40 may flex towards the substrate S, further reducing the overall height.

Figure 5:
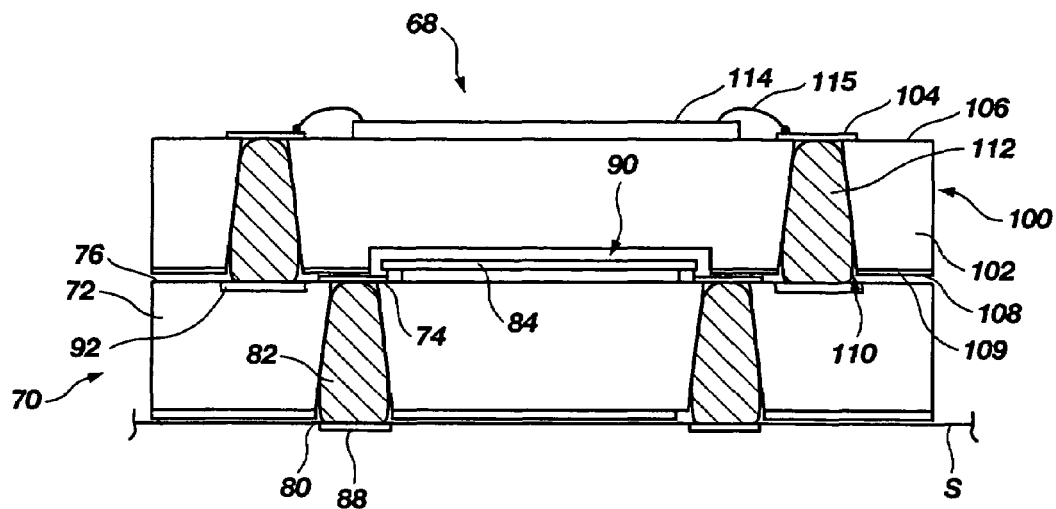
FIG. 5 is a sectional side view of one possible stacked assembly of two alternative embodiments of semiconductor packages made in accordance with the principles of the present invention.

FIG. 5 depicts a side, cross-sectional view of a stack 68 of semiconductor assemblies fabricated in accordance with the principles of the present invention. It will be appreciated that FIG. 5, like the other figures in the present application, is not to scale but is instead representational of the principles of the present invention. A first semiconductor assembly 70 is attached to a substrate S, as discussed above with respect to FIGS. 2 and 3. Conductive elements 82 substantially residing within recesses 80 are connected to contact pads 88 of the substrate S. A semiconductor die 84 is disposed on a first surface 76 of the interposer 72 and is in electrical communication with the conductive elements 82 through the conductive traces 74. Interposer 72 of assembly 70 includes an interconnect structure allowing for connection with another semiconductor assembly 100 stacked on the first surface 76. In the depicted embodiment, the interconnect structure is represented by the interconnect pads 92. Interconnect pads 92 function similar to contact pads 88, allowing another semiconductor assembly to be electrically attached thereto. Interconnect pads 92 may be connected to the pattern of conductive traces 74, and to conductive elements 82 therethrough, or may be directly connected to a recess 80, with a conductive element therein. Alternatively, a via or other connective structure may be used to connect the stacked assembly with either the substrate S or the first assembly 70.

A second semiconductor assembly 100 is stacked adjacent the first assembly 70. Second semiconductor assembly 100 includes a semiconductor die 114 attached to the first surface 106 of an interposer 102. The semiconductor die 114 is in electrical communication with a pattern of conductive traces 104, located on the first surface 106, depicted in this embodiment through the wirebond connection 115. Recesses 110 are disposed in the second surface 108 and pass through the body of the interposer 102 to allow communication with the conductive traces 104. Each recess 110 may allow electrical communication with one or more conductive traces 104. Conductive elements 112 are disposed in the recesses 110 and may be used for attachment of the semiconductor assembly 100 and electrical communication with the semiconductor die 114. Note that second semiconductor assembly 100 includes a solder mask 109 disposed adjacent to the second surface 108 for facilitating the formation of conductive elements 112.

The second semiconductor assembly 100 further includes a die recess 90 accessible on the second surface 108. Die recess 90 may be formed in any suitable manner, as discussed above with respect to the interconnection recesses 110. The die recess 90 is configured to contain at least a portion of semiconductor die 84. The dimensions of the die recess 90 may vary with different embodiments to accomplish this purpose. If necessary, die recess 90 may extend to or even through the first surface 106, desirably at a location other than die 114, or conductive traces 104.

Second semiconductor assembly 100 is positioned with second surface 108 of interposer 102 adjacent to the first surface 76 of interposer 72 of the first assembly 70. Second semiconductor assembly 100 is positioned such that conductive elements 112 are aligned with the interconnect pads 92, and die recess 90 is aligned with die 84. Conductive elements 112 are then bonded to the interconnect pads 92, coupling the assemblies into a stacked array and establishing electrical communication between the assemblies 70 and 100 and the substrate S.

Figure 6:
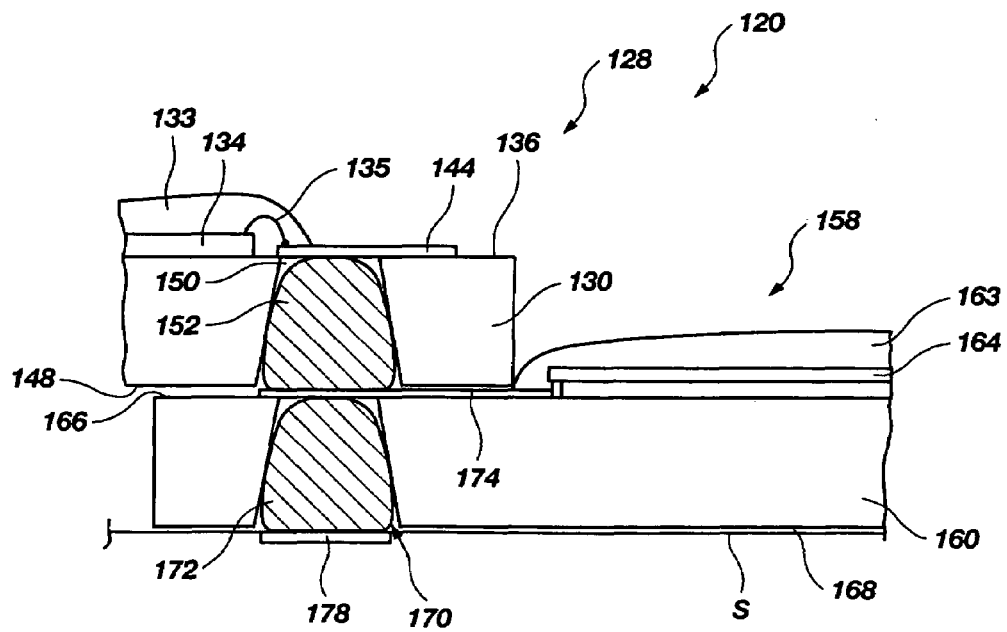
FIG. 6 is a sectional side view of a portion of another stacked assembly of a fourth alternative embodiment of semiconductor packages made in accordance with the principles of the present invention.

Turning to FIG. 6, there is depicted a portion of a stack 120 of semiconductor assemblies 128 and 158. The first semiconductor assembly 158 includes a semiconductor die 164 attached to the first surface 166 of an interposer 160. Semiconductor die 164 is in electrical communication with a pattern of conductive traces 174 disposed on the first surface 166. A recess 170 is accessible on the second opposite surface 168 of the interposer 160. A conductive element 172 is disposed substantially within the recess 170. Note that in the depicted embodiment, semiconductor die 164 is encapsulated with an encapsulant material 163, providing additional protection to the semiconductor die 164. First assembly 158 is attached to a substrate S, with conductive element 172 bonded to contact pad 178 of substrate S and second surface 168 adjacent to substrate S. It will be appreciated that the embodiment of first assembly 158, as shown in FIG. 6, may include a plurality of recesses 170 and conductive elements 172 forming an array, such as a ball grid array. All such embodiments are included within the scope of the present invention.

Second semiconductor assembly 128 similarly includes a semiconductor die 134 attached to the first surface 136 of interposer 130. Semiconductor die 134 is in electrical communication with at least one member of a pattern of conductive traces 144 disposed on first surface 136, depicted here by wirebond 135. Semiconductor die 134 and the electrical connection to the conductive traces may be encapsulated with an encapsulant material 133. An interconnect recess 150 is accessible on the opposite second surface 148 and passes into the body of the interposer 130. At least one member of the conductive traces 144 is accessible through the interconnect recess 150. A conductive element, such as solder ball 152, is disposed in the interconnect recess 150 in an electrically communicative connection with at least one member of the conductive traces 144. It will be appreciated that second semiconductor assembly 128 may include any number of interconnect recesses 150 and solder balls 152, forming a grid array on the second surface 148 for connection of the second semiconductor assembly 128.

A stacked assembly 120 is formed by attaching the second surface 148 of interposer 130 of second semiconductor assembly 128 to the first surface 166 of interposer 160 of first assembly 158. Interconnect recess 150 is aligned with an interconnect structure, allowing the assemblies to be attached in electrical communication, through solder ball 152. In the embodiment depicted in FIG. 6, the interconnect structure is represented as one or more members of conductive traces 174 disposed on first surface 166 of the first assembly 158. As discussed above, the interconnect structure may be any structure known, or readily ascertainable, to those skilled in the art that may be used to establish electrical communication between first assembly 158 and second semiconductor assembly 128. All such structures are within the scope of the present invention.

As solder ball 152 is reflowed to attach the interconnect structures of the pattern of conductive traces 174, any space remaining within interconnect recess 150 is filled by solder. This allows second surface 148 to draw closer to the first surface 166, further reducing the height of the stacked assembly 120. In embodiments where interposer 130 is constructed from a flexible material, such as a polyimide tape, the reduced rigidity of second semiconductor assembly 128 allows further reduction in height. A nonrigid embodiment of second semiconductor assembly 128 is able to flex and adjust within the available space, drawing closer to the adjacent first assembly 158. Through these attributes, some embodiments of the present invention may be used to create stacks of semiconductor assemblies with a reduction in the overall height of the stacked assemblies, conserving real estate in a device in both lateral and vertical directions.

Figure 7:
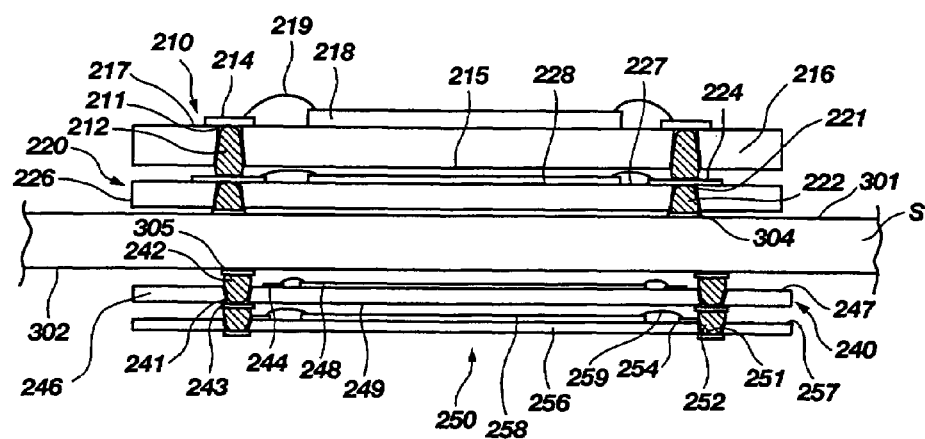
FIG. 7 is a side, cross-sectional view of one embodiment of a multiple component stack of semiconductor assemblies fabricated in accordance with the principles of the present invention.

Turning to FIG. 7, depicted is a side, cross-sectional view of a multiple component stack of semiconductor assemblies fabricated in accordance with the principles of the present invention. It will be appreciated that FIG. 7, like the other figures in the present application, is not to scale but is instead representational of the principles of the present invention. Similar to FIG. 5, a first semiconductor assembly 220 is attached to a substrate S, which may be a printed circuit board (PCB) or similar structure, as discussed elsewhere herein. Conductive elements 222, substantially residing within recesses 221 of interposer 226 are connected to contact pads 304 of the substrate S, on first surface 301 thereof. A semiconductor die 228 is disposed on a first surface 227 of the interposer 226 and is in electrical communication with the conductive element 222 through the conductive traces 224. Interposer 226 includes an interconnect structure allowing for connection with another semiconductor assembly 210 stacked on the first surface 227. In the depicted embodiment, the interconnect structure is represented by the conductive traces 224, as discussed with respect to FIGS. 5 and 6.

A second semiconductor assembly 210 is stacked adjacent the first semiconductor assembly 220. Second semiconductor assembly 210 includes a semiconductor die 218 attached to the first surface 217 of an interposer 216. The semiconductor die 218 is in electrical communication with a pattern of conductive traces 214, located on the first surface 217, depicted in this embodiment through the wirebond connection 219. Recesses 211 are disposed in the second surface 215 and pass through the body of the interposer 216 to allow communication with the conductive traces 214. Each recess 211 may allow electrical communication with one or more conductive traces 214. Conductive elements 212 are disposed in the recesses 211 and may be used for attachment of the second semiconductor assembly 210 and electrical communication with the semiconductor die 218. Second semiconductor assembly 210 may include a die recess as in the embodiment of FIG. 5.

Second semiconductor assembly 210 is positioned with second surface 215 of interposer 226 adjacent to the first surface 227 of interposer 226 of the first semiconductor assembly 220. Second semiconductor assembly 210 is positioned such that conductive elements 212 are aligned with the conductive traces 224. Conductive elements 212 are then bonded to the conductive traces 224, coupling the assemblies into a stacked array and establishing electrical communication between the semiconductor assemblies 210 and 220 and the substrate S.

Similarly, a stack of semiconductor assemblies fabricated in accordance with the principles of the present invention is located at a second surface 302 of the substrate S. A third semiconductor assembly 240 is attached to the second surface 302 of substrate S. Conductive elements 242 substantially residing within recesses 241 are connected to contact pads 305 of the substrate S, on the second surface 302. A semiconductor die 248 is disposed on a first surface 247 of the interposer 246 and is in electrical communication with the conductive element 242 through the conductive traces 244. Interposer 246 includes an interconnect structure allowing for connection with another assembly 250 stacked on the second surface 249. In the depicted embodiment, the interconnect structure is represented by the interconnect pads 243 located on the second surface 249 of interposer 246 and similar to those discussed previously herein.

A fourth semiconductor assembly 250 is stacked adjacent the third assembly 240. Fourth assembly 250 includes a semiconductor die 258 attached to the first surface 257 of an interposer 256. The semiconductor die 258 is in electrical communication with a pattern of conductive traces 254, located on the first surface 257, depicted in this embodiment through the wirebond connection 259. Recesses 251 are disposed in the first surface 257 and contain conductive elements 252 protruding slightly therefrom. Conductive elements 252 may be used for attachment of the fourth semiconductor assembly 250 and electrical communication with the semiconductor die 258. Third assembly 240 may include a die recess as in the embodiment of FIG. 5.

Fourth assembly 250 is positioned with first surface 257 of interposer 256 adjacent to the second surface 249 of interposer 246 of the third assembly 240. Fourth assembly 250 is positioned such that conductive elements 252 are aligned with the interconnect pads 243. Conductive elements 252 are then bonded to the interconnect pads 243, coupling the assemblies into a stacked array and establishing electrical communication between the assemblies 240 and 250 and the substrate S.

It will be appreciated that the stacked semiconductor assemblies 210, 220, 240 and 250 are representational only and that as many assemblies as desired may be utilized to form stacks on a surface of a substrate S. By stacking multiple assemblies on the different surfaces of the substrate S, further reductions in the amount of space consumed by an assembly inside an electronic device may be realized.

In accordance with the description provided, the present invention includes a method of forming a stackable semiconductor assembly with recessed interconnections. This method may be practiced by providing a substrate to form an interposer body having first and second surfaces, then disposing electrically conductive traces on the first surface, disposing a stacking electrical interconnection structure on the first surface and forming a connection recess in the second surface and passing through the interposer body to expose at least one electrically conductive trace disposed on the first surface. A semiconductor die is then disposed on the first surface, such that the semiconductor die is in electrical communication with at least one connecting electrically conductive trace disposed on the first surface, then an electrically conductive connection material is disposed substantially within the connection recess, such that the electrically conductive material is in electrically conductive contact with the at least one exposed electrically conductive trace.

When the method is practiced, a number of options may be utilized to optimize the procedure. For example, the die may be attached in conventional or flip chip fashion. The act of disposing the electrically conductive compound in the connection recess could include disposing the electrically conductive compound in electrically conductive contact with the at least one connecting electrically conductive trace. The electrically conductive compound connection may be a solder paste disposed in the recesses and reflowed to form solder balls. The substrate may be a polyimide flex tape, or other material. The electrically conductive traces could be formed by etching a metallic layer disposed on the first surface or by disposing traces directly upon the first surface. An electrically conductive trace may serve as the interconnect structure, or a separate connection pad may be used. Further, a die recess may be formed in the second surface, if desired. It will be appreciated that these options are illustrative only and that other useful options known or readily ascertainable to those skilled in the art may be used.

Further, it will be appreciated that the present invention includes a method of forming a semiconductor assembly. This method may be practiced by providing a nonrigid substrate to form an interposer body having first and second surfaces, disposing electrically conductive traces on the first surface and forming a connection recess in the second surface and passing through the interposer body to expose at least one electrically conductive trace disposed on the first surface. A semiconductor die is then provided and attached to the first surface in electrical communication with at least one connecting electrically conductive trace. Next, an electrically conductive connection compound is disposed substantially within the connection recess in electrically conductive contact with the at least one exposed electrically conductive trace.

As mentioned above, when this method is practiced, a number of options can be utilized to optimize the procedure. For example, the die may be attached in conventional or flip chip fashion. The act of disposing the electrically conductive compound in the connection recess could include disposing the electrically conductive compound in electrically conductive contact with the at least one connecting electrically conductive trace. The electrically conductive compound may be a solder paste disposed in the recesses and reflowed to form solder balls; this process may be aided with the application of a solder mask to the second surface. Alternatively, the second surface may be flooded with solder balls, followed by the removal of those solder balls that protrude above a certain distance. The substrate may be a polyimide flex tape, or other material. The electrically conductive traces may be formed by etching a metallic layer disposed on the first surface or by disposing traces directly upon the first surface. An electrically conductive trace may serve as the interconnect structure, or a separate connection pad may be used. Further, a die recess may be formed in the second surface, if desired. It will be appreciated that these options are illustrative only and that other useful options known or readily ascertainable to those skilled in the art may be used.

It will be appreciated that the present invention also includes a method of forming a stack of semiconductor assemblies. A first semiconductor assembly is assembled by providing a first substrate to form a first interposer body having first and second surfaces, disposing first electrically conductive traces on the first surface, forming at least a first connection recess in the second surface and passing through the first interposer body to expose at least one first electrically conductive trace disposed on the first surface, providing a first semiconductor die, attaching the first semiconductor die to the first surface in electrical communication with at least one connecting first electrically conductive trace disposed on the first surface, disposing an electrically conductive connection compound substantially within the at least a first connection recess and in electrically conductive contact with the at least one exposed first electrically conductive trace. A second semiconductor assembly is assembled by providing a second substrate to form a second interposer body having third and fourth surfaces, disposing second electrically conductive traces on the third surface, disposing at least a first stacking electrical interconnection structure on the third surface, forming at least a second connection recess in the fourth surface and passing through the second interposer body to expose at least one exposed second electrically conductive trace disposed on the third surface, providing a second semiconductor die, attaching the second semiconductor die to the third surface in electrical communication with at least one connecting second electrically conductive trace disposed on the second surface, and disposing an electrically conductive connection compound substantially within the at least a second connection recess and in electrically conductive contact with the at least one exposed second electrically conductive trace. The second surface of the first semiconductor assembly is attached to the third surface of the second semiconductor assembly, such that the at least a first connection recess is aligned with the stacking electrical interconnection structure, and the electrically conductive connection compound disposed within the at least a first connection recess makes electrically conductive contact to the at least a first stacking electrical interconnection structure.

It will be apparent that details of the apparatus and methods herein described can be varied considerably without departing from the concept and scope of the invention. The claims alone define the scope of the invention as conceived and as described herein.

What is claimed is:

1. A method of forming a semiconductor assembly comprising:
    forming an interposer body having first and second surfaces from a nonrigid substrate;
    disposing a plurality of electrically conductive traces on the first surface of the interposer body;
    forming a plurality of connection recesses from the second surface passing through the interposer body to respectively expose a portion of one of the plurality of electrically conductive traces;
    disposing a preformed solder ball in each of the plurality of connection recesses;
    heating the solder balls disposed in the recesses of the plurality to reflow and protrude slightly beyond a mouth of each connection recess; and
    attaching a semiconductor die to the first surface of the interposer body and placing the semiconductor die in electrical communication with at least one of the plurality of electrically conductive traces .

2. The method of claim 1, further comprising disposing an encapsulant over the semiconductor die.

3. The method of claim 1, wherein attaching the semiconductor die to the first surface comprises attaching the semiconductor die to the first surface with an adhesive and placing the semiconductor die in electrical communication with the at least one of the plurality of electrically conductive traces comprises forming a wirebond connection between the semiconductor die and the at least one of the plurality of electrically conductive traces.

4. The method of claim 1, wherein attaching the semiconductor die to the first surface and placing the semiconductor die in electrical communication with the at least one of the plurality of electrically conductive traces comprises attaching the semiconductor die in flip chip fashion to the first surface with an electrically conductive material to make an electrical and mechanical connection between the semiconductor die and the at least one of the plurality of electrically conductive traces.

5. The method of claim 4, wherein attaching the semiconductor die to the first surface and placing the semiconductor die in electrical communication with the at least one of the plurality of electrically conductive traces comprises disposing the semiconductor die bearing an array of solder balls on the first surface and reflowing the solder balls to electrically and mechanically connect the semiconductor die to the at least one of the plurality of electrically conductive traces.

6. The method of claim 1, wherein forming an interposer body from a nonrigid substrate comprises forming the interposer body from a polymide flex tape.

7. The method of claim 1, wherein disposing a plurality of electrically conductive traces comprises forming metallic traces on the first surface.

8. The method of claim 7, wherein forming metallic traces comprises etching a metallic layer disposed on the first surface.

9. A method of forming a semiconductor assembly comprising:
    forming an interposer body having a first surface and a second surface from a nonrigid substrate;
    disposing a plurality of electrically conductive traces on the first surface;
    disposing a plurality of electrically conductive interconnect structures on the first surface at locations laterally offset from locations of connection recesses;
    forming a plurality of connection recesses from the second surface passing through the interposer body to respectively expose a portion of one of the plurality of electrically conductive traces;
    disposing an electrically conductive material in the form of a solder within each of the plurality of connection recesses in a volume sufficient to reside substantially within each of the plurality of connection recesses;
    heating the solder within each of the plurality of connection recesses to reflow and protrude slightly beyond a mouth of each recess; and
    attaching a semiconductor die to the first surface of the interposer body and placing the semiconductor die in electrical communication with at least one of the plurality of electrically conductive traces.

10. The method of claim 9, further comprising disposing an encapsulant over the semiconductor die.

11. The method of claim 9, wherein attaching the semiconductor die to the interposer body comprises attaching the semiconductor die to the first surface with an adhesive and placing the semiconductor die in electrical communication with at least one of the plurality of conductive traces comprises forming a wirebond connection between the semiconductor die and the at least one of the plurality of electrically conductive traces.

12. The method of claim 9, wherein attaching the semiconductor die to the first surface and placing the semiconductor die in electrical communication with the at least one of the plurality of electrically conductive traces comprises attaching the semiconductor die in flip chip fashion on the first surface with an electrically conductive material to make an electrical and mechanical connection between the semiconductor die and the at least one of the plurality of electrically conductive traces.

13. The method of claim 12, wherein attaching the semiconductor die to the first surface and placing the semiconductor die in electrical communication with the at least one of the plurality of electrically conductive traces comprises disposing the semiconductor die bearing an array of solder balls on the first surface and reflowing the solder balls to electrically and mechanically connect the semiconductor die to the at least one of the plurality of electrically conductive traces.

14. The method of claim 9, wherein disposing a plurality of electrically conductive interconnect structures comprises disposing a plurality of electrical connection pads on the first surface.

15. The method of claim 9, wherein disposing a plurality of electrically conductive interconnect structures comprises disposing a plurality of electrically conductive pads on the first surface.

16. The method of claim 9, wherein disposing a solder within each of the plurality of connection recesses comprises flooding the second surface with a plurality of solder balls and then removing solder balls not residing substantially within one of the plurality of connection recesses.

17. The method of claim 9, wherein disposing a solder within each of the plurality of connection recesses comprises flooding the second surface with a plurality of solder balls and then removing solder balls not residing substantially within one of the plurality of connection recesses.

18. The method of claim 17, further comprising disposing a solder mask over the second surface, prior to disposing the solder paste.

19. The method of claim 9, wherein providing a nonrigid substrate to form an interposer body comprises providing a polyimide flex tape.

20. The method of claim 9, further comprising forming a recess in the second surface sized and configured to receive at least a portion of a semiconductor die therein.

21. The method of claim 9, wherein disposing a plurality of electrically conductive traces comprises forming metallic traces on the first surface.

22. The method of claim 21, wherein forming metallic traces comprises etching a metallic layer disposed on the first surface.

23. A method of forming a stacked semiconductor assembly comprising:
    forming a first semiconductor assembly by:
        forming a first interposer body having first and second surfaces from a nonrigid substrate;
        forming a die recess in the second surface sized and configured to receive at least a portion of a semiconductor die therein;
        disposing first electrically conductive traces on the first surface;
        forming at least a first connection recess from the second surface passing through the first interposer body to expose a portion of at least one of the first electrically conductive traces disposed on the first surface;
        attaching a first semiconductor die to the first surface in electrical communication with at least one of the first electrically conductive traces disposed on the first surface; and
        disposing an electrically conductive material substantially within the at least the first connection recess and in electrically conductive contact with the exposed portion of the at least one of the first electrically conductive traces;
    forming a second semiconductor assembly by:
        forming a second interposer body having third and fourth surfaces from a nonrigid substrate;
        disposing second electrically conductive traces on the third surface;
        disposing at least a first stacking electrical interconnection structure on the third surface;
        forming at least a second connection recess from the fourth surface passing through the second interposer body to expose a portion of at least one of the second electrically conductive traces disposed on the third surface;

attaching a second semiconductor die to the third surface in electrical communication with at least one of the second electrically conductive traces disposed on the third surface;

disposing an electrically conductive material substantially within the at least the second connection recess and in electrically conductive contact with the exposed portion of the at least one of the second electrically conductive traces; and superimposing the first semiconductor assembly on the second semiconductor assembly, such that at least a portion of the second semiconductor die is received within the die recess, the at least the first connection recess is aligned with the at least the first stacking electrical interconnection structure, and the electrically conductive material disposed within the at least the first connection recess makes electrically conductive contact to the at least the first stacking electrical interconnection structure.

24. The method of claim 23, wherein forming a die recess in the second surface sized and configured to receive at least a portion of a semiconductor die therein is effected concurrently with forming the at least a first connection recess.

25. The method of claim 23, wherein receiving the at least a portion of the second semiconductor die within the die recess aligns the at least the first connection recess with the at least the first stacking electrical interconnection structure.

26. The method of claim 23, wherein disposing the electrically conductive material substantially within the at least the first connection recess comprises disposing the electrically conductive material in electrically conductive contact with the at least one of the first electrically conductive traces in electrical communication with the first semiconductor die.

27. The method of claim 23, wherein disposing the at least the first stacking electrical interconnection structure comprises disposing an electrical connection pad.

28. The method of claim 27, wherein disposing the at least the first stacking electrical interconnection structure comprises disposing an electrically conductive trace on the first surface.

29. The method of claim 23, wherein disposing an electrically conductive material substantially within the at least the first connection recess comprises disposing solder within the at least the first connection recess.

30. The method of claim 29, wherein disposing solder within the at least the first connection recess comprises flooding the second surface with a number of solder balls and then removing solder balls not disposed substantially within the at least the first connection recess.

31. The method of claim 29, wherein disposing solder within the at least the first connection recess comprises disposing a solder paste within the at least the first connection recess and then reflowing the solder paste to form a solder ball.

32. The method of claim 31, further comprising disposing a solder mask over the second surface prior to disposing the solder paste.

33. The method of claim 23, wherein forming the first interposer body from a nonrigid substrate comprises using a polyimide flex tape.

34. The method of claim 23, wherein forming the second interposer body from a nonrigid substrate comprises using a polyimide flex tape.

35. The method of claim 23, wherein disposing first electrically conductive traces comprises forming first metallic traces on the first surface.

36. The method of claim 35, wherein forming first metallic traces comprises etching a first metallic layer disposed on the first surface.

37. The method of claim 36, wherein disposing second electrically conductive traces comprises forming second metallic traces on the third surface.

38. The method of claim 37, wherein forming second metallic traces comprises etching a second metallic layer disposed on the third surface.

39. A method of forming a stacked semiconductor assembly comprising:

forming a first semiconductor assembly by:
  forming a first interposer body having first and second surfaces from a first nonrigid substrates;
  disposing at least one first electrically conductive trace on the second surface;
  forming at least a first connection recess from the first surface passing through the first interposer body to expose a portion of the at least one first electrically conductive trace disposed on the second surface;
  forming a die recess in the first surface sized and configured to receive at least a portion of a semiconductor die therein;
  attaching a first semiconductor die to the second surface;
  disposing an electrically conductive material substantially within the at least the first connection recess and in electrically conductive contact with the exposed portion of the at least one first electrically conductive trace;

forming a second semiconductor assembly by:
  forming a second interposer body having third and fourth surfaces from a second nonrigid substrate;
  disposing at least one second electrically conductive trace on the fourth surface;
  disposing at least a first stacking electrical interconnection structure on the fourth surface,
  forming at least a second connection recess from the third surface passing through the second interposer body to expose the at least one second electrically conductive trace disposed on the fourth surface;
  attaching the second semiconductor die to the fourth surface;
  disposing an electrically conductive material substantially within the at least the second connection recess and in electrically conductive contact with the exposed portion of the at least one second electrically conductive trace; and superimposing the first semiconductor assembly on the second semiconductor assembly, with at least a portion of the second semiconductor die received within the die recess, the at least the first connection recess is aligned with the stacking at least the first electrical interconnection structure, and the electrically conductive material disposed within the at least the first connection recess makes electrically conductive contact to the at least the first stacking electrical interconnection structure.

40. The method of claim 39, wherein forming a die recess in the first surface is effected concurrently with forming the at least a first connection recess.

41. The method of claim 39, wherein receiving the at least a portion of the second semiconductor die within the die recess aligns the at least the first connection recess with the at least the first stacking electrical interconnection structure.

42. The method of claim 39, wherein disposing the electrically conductive material in the at least the first connection recess comprises disposing the electrically conductive material in electrically conductive contact with the at least one first electrically conductive trace.

43. The method of claim 39, wherein disposing the at least the first stacking electrical interconnection structure comprises disposing an electrical connection pad.

44. The method of claim 39, wherein disposing the at least the first stacking electrical interconnection structure comprises disposing an electrically conductive trace on the third surface.

45. The method of claim 39, wherein disposing an electrically conductive material substantially within the at least the first connection recess comprises disposing solder within the at least the first connection recess.

46. The method of claim 45, wherein disposing solder within the at least the first connection recess comprises disposing a solder paste within the at least the first connection recess and then reflowing the solder paste to form a solder ball.

47. The method of claim 46, further comprising disposing a solder mask over the first surface prior to disposing the solder paste.

48. The method of claim 39, wherein forming the first interposer body from a first nonrigid substrate comprises using a polyimide flex tape.

49. The method of claim 39, wherein forming the second interposer body from a second nonrigid substrate comprises using a polyimide flex tape.

50. The method of claim 39, wherein disposing at least a first electrically conductive trace comprises forming first metallic traces on the second surface.

51. The method of claim 50, wherein forming first metallic traces comprises etching a first metallic layer disposed on the second surface.

52. The method of claim 50, wherein disposing at least one second electrically conductive trace comprises forming second metallic traces on the fourth surface.

53. The method of claim 52, wherein forming second metallic traces comprises etching a second metallic layer disposed on the fourth surface.

* * * * *

UNITED STATES PATENT AND TRADEMARK OFFICE
CERTIFICATE OF CORRECTION

PATENT NO. : 7,112,520 B2 Page 1 of 1
APPLICATION NO. : 10/150516
DATED : September 26, 2006
INVENTOR(S) : Lee et al.

It is certified that error appears in the above-identified patent and that said Letters Patent is hereby corrected as shown below:

In column 10, line 45, in Claim 1, delete "traces ." and insert -- traces. --, therefor.

In column 11, line 9, in Claim 6, delete "polymide" and insert -- polyimide --, therefor.

In column 12, line 7, in Claim 15, after "disposing a" insert -- second --.

In column 12, line 7, in Claim 15, delete "pads" and insert -- traces --, therefor.

In column 12, lines 16-18, in Claim 17, delete "flooding the second surface with a plurality of solder balls and then removing solder balls not residing substantially within one of the plurality of" and insert -- disposing a solder paste within each of the --, therefor.

In column 14, line 17, in Claim 39, delete "substrates;" and insert -- substrate; --, therefor.

Signed and Sealed this

Fifteenth Day of April, 2008

JON W. DUDAS
*Director of the United States Patent and Trademark Office*